United States Patent [19]

Bauhahn

[11] Patent Number: 4,577,213

[45] Date of Patent: Mar. 18, 1986

[54] INTERNALLY MATCHED SCHOTTKY BARRIER BEAM LEAD DIODE

[75] Inventor: Paul E. Bauhahn, Fridley, Minn.

[73] Assignee: Honeywell Inc., Minneapolis, Minn.

[21] Appl. No.: 586,161

[22] Filed: Mar. 5, 1984

[51] Int. Cl.$^4$ ............................................. H01L 23/48
[52] U.S. Cl. ........................................ 357/69; 357/15; 357/51; 357/65; 357/68; 427/84
[58] Field of Search ........................ 357/69, 51, 15, 68, 357/65; 427/84; 148/DIG. 139

[56] References Cited

U.S. PATENT DOCUMENTS 3,805,376  4/1974  D'Asaro ........................ 357/69

FOREIGN PATENT DOCUMENTS

| 0116778 | 10/1978 | Japan | 357/51 |
| 0159866 | 12/1979 | Japan | 357/51 |
| 0085044 | 6/1980 | Japan | 357/51 |
| 0061652 | 4/1983 | Japan | 357/51 |
| 58-178539 | 10/1983 | Japan | 357/15 |
| 2123209 | 1/1984 | United Kingdom | 357/51 |

OTHER PUBLICATIONS

IEEE Transactions on Electron Devices, vol. Ed 25 #6, Jun. 1978, pp. 710–713, by Immorlica.
IEDM Conference Tech. Digest, Dec. 1976, "High Performance Mixer Diode" by Denlinger.

*Primary Examiner*—Andrew J. James
*Assistant Examiner*—Mark Prenty
*Attorney, Agent, or Firm*—Omund R. Dahle

[57] ABSTRACT

An improved internally matched Schottky barrier beam lead diode for use in millimeter wave frequency circuits. In this diode device which is made on a chip, a reactive shunt loop comprising a matching inductor and series connected capacitor is fabricated on the chip adjacent the diode and couples the ohmic beam lead to the Schottky contact beam lead.

9 Claims, 7 Drawing Figures

APPROXIMATE EQUIVALENT CIRCUIT

INTERNALLY MATCHED SCHOTTKY BARRIER BEAM LEAD DIODE

BACKGROUND AND SUMMARY OF THE INVENTION

This invention is directed to improvements in Schottky barrier beam lead diodes designed for operation in millimeter wave circuits. Millimeter wave beam lead Schottky barrier diodes are known in the art as shown for example in U.S. Pat. No. 4,301,233.

In the present invention the Schottky barrier beam lead diode is intended for use as a mixer in millimeter wave circuits. To obtain high electrical performance, that is, low conversion loss and low noise, using conventional beam lead diodes in these circuits requires great care in diode mounting as well as good mixer circuit design. Since the matching elements in the circuit are normally located away from the diode junction, bandwidth is limited and mixer performance tends to be not very repeatable. In the present invention the Schottky barrier beam lead diode is improved by placing the primary matching elements on the diode structure itself. This makes the diode relatively insensitive to mounting techniques and increases its electrical performance over a wide bandwidth.

DESCRIPTION

Figure 1:
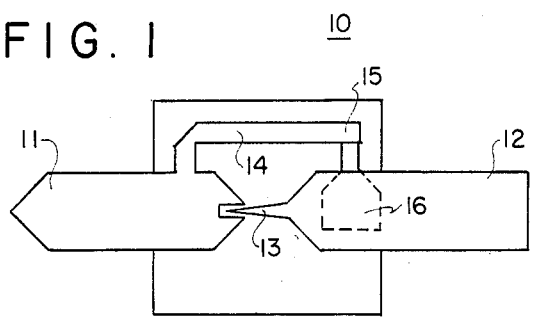
FIG. 1 is a top plan view of the internally matched Schottky barrier beam lead diode of this invention.

In the present invention a gallium arsenide Schottky barrier beam lead diode 10 used at millimeter wave frequencies is improved by applying internal matching structure elements on the diode. Referring to the top plan view of FIG. 1 there are shown beam leads 11 and 12 which are on top of a dielectric and which reach through vias in the dielectric to the Schottky below. An extended portion 13 of the beam lead is connected down to a Schottky contact 26 on the GaAs layer 21 (see FIG. 3) at the junction region of the diode. The internal matching structure is fabricated on the dielectric adjacent the Schottky diode, as follows. Connected in a shunt path around the Schottky diode from the ohmic lead 11 is a single turn matching inductor 14, which is completed by means of a view 15 through the dielectric and metallization under the dielectric (under beam lead 12) to form a capacitor 16. Further description follows below in connection with FIG. 3.

Figure 2:
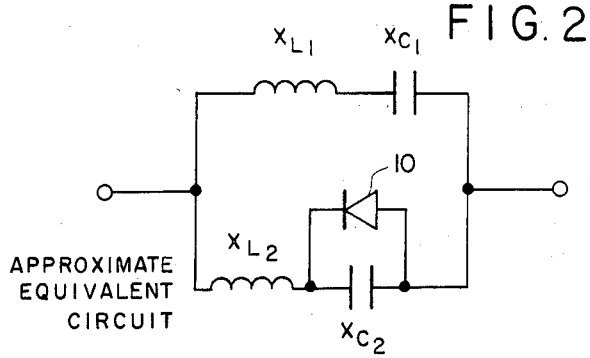
FIG. 2 is an approximate equivalent circuit of the device of FIG. 1 as used.

In the approximate equivalent circuit shown in FIG. 2 the inductor $L_1$ is approximately equivalent to the inductor 14 of FIG. 1 and the capacitor $C_1$ is approximately equivalent to the capacitor 16. In the field of high frequency mixers not only is matching desired at the operating frequency, but mismatching is needed for higher harmonics of the operating frequency. This is accomplished using the internal matching described. Thus, as is shown in the remainder of the sketch of FIG. 2, the equivalent circuit of a beam lead diode mounted in a circuit can be described by the diode parasitic capacitive reactance $X_{C2}$, the lead inductive reactance $X_{L2}$ and the matching circuits inductive reactance $X_{L1}$ and capacitive reactance $X_{C1}$. By adjusting the geometry of the matching inductor, the matching capacitor and the diode area, the impedance presented at the terminals of the beam lead diode can be made approximately resistive over a rather wide range of frequencies. The elimination of large reactive currents at the operating frequency flowing in the diode lead makes the diode mounting relatively noncritical. At the same time the higher order harmonics can be readily suppressed, improving the mixer noise performance.

In the particular implementation of the invention shown in FIG. 1, $|X_{L1}| > |X_{C1}|$ and $|X_{C2}| > |X_{L2}|$ and $|X_{L1}| - |X_{C1}| \cong |X_{C2}| - |X_{L2}|$. This resulting parallel resonance can be used to provide impedance matching at the fundamental operating frequency and mismatch at harmonics.

There are other implementations of this invention which can be used. The matching capacitor 16 (that is $C_1$) may be fabricated under the ohmic lead 11 on the left rather than under the Schottky contact 12 on the right as shown in the figure. At lower frequencies, the matching inductor 14 ($L_1$) may be fabricated as a multiturn or partial spiral inductor. Capacitor $C_1$ may also be implemented as a multiple-finger planar capacitor or as a parallel coupled line depending on the frequency.

Figure 3A:
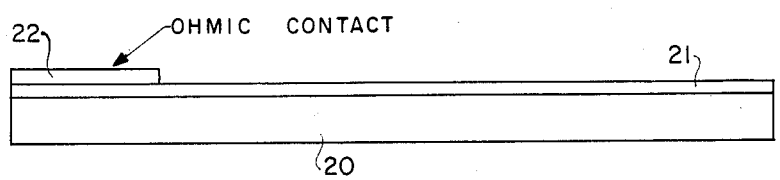
FIG. 3A to 3E are partial cross sections of FIG. 1 and show process steps in the fabrication of the device of FIG. 1.
Figure 3B:
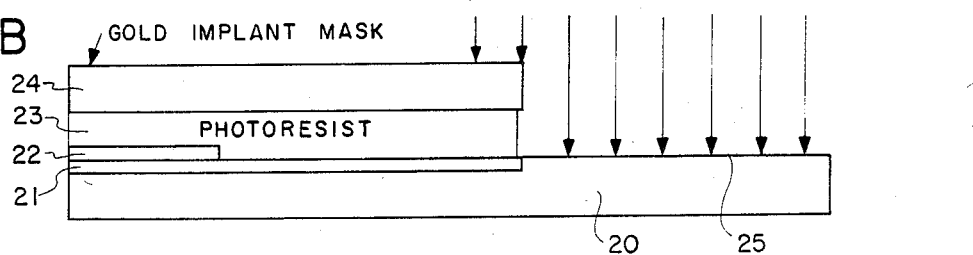
Figure 3C:
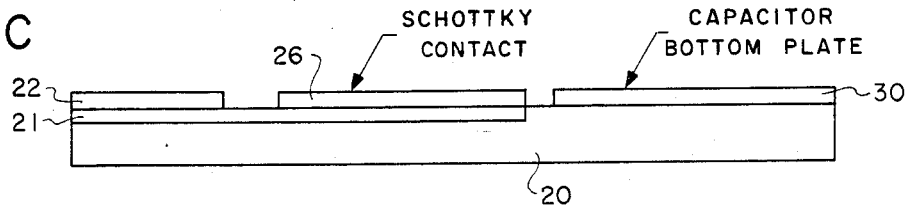
Figure 3D:
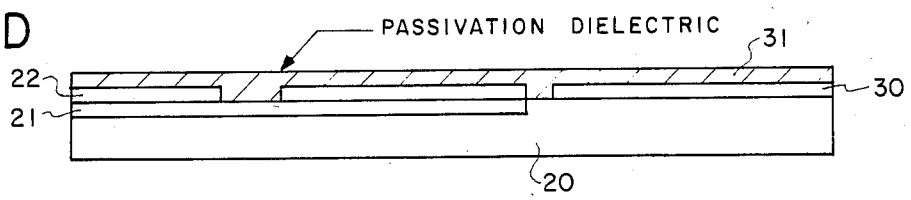

Turning now to FIG. 3 which illustrates certain process steps used in fabricating one embodiment of the described invention, there is shown particularly in FIG. 3A a conductive epitaxial GaAs layer 21 on a semi-insulating substrate 20 and having an ohmic contact 22 fabricated on the surface of the layer 21 preferably using the liftoff process.

Figure 3E:
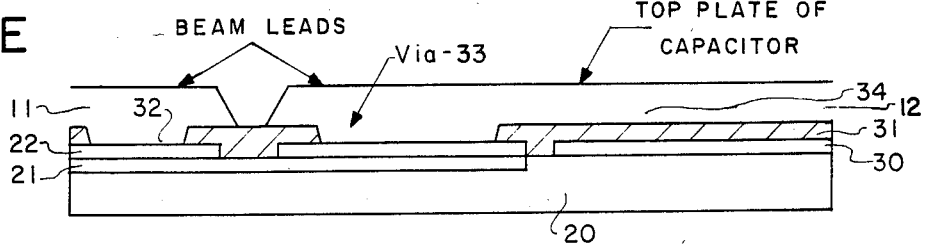

In a succeeding step a photoresist layer 23 and a gold implant mask 24 is deposited over the Schottky area and including ohmic contact 22. A proton or deuteron implant converts the surrounded uncovered surface area of GaAs layer 21 generally shown as area 25 to an insulating or semi-insulating layer so that a capacitor plate and other conductors can be fabricated on it. The photoresist 23 and gold implant mask 24 are removed. Schottky contact 26 (FIG. 3C) and capacitor bottom plate or pad 30 are formed on the surface of the layer 21, preferably by the liftoff process, the capacitor bottom plate being on the now insulating portion of the layer 21. From FIG. 1 it can be seen that the capacitor bottom plate extends to the location of the via 15. A passivation dielectric layer 31 is formed over the surface (FIG. 3D) to passivate the diode. In FIG. 3E the beam leads 11 and 12 are plated over the dielectric layer 31. A via 32 through the dielectric provides contact at ohmic contact 22 from beam lead 11. Similarly a via 33 allows connection of beam lead 12 to Schottky contact 26. Portion 34 of beam lead 12 forms the top plate of capacitor 16 and lies above bottom plate 30. The single turn matching inductor 14 which extends from beam lead 11 to capacitor plate 30 has a major portion which can be plated when beam leads 11 and 12 are plated. As was described in connection with FIG. 1, a via through the dielectric layer 31 completes the conductor path of the inductor 14 to the lower capacitor plate 30 of capacitor 16.

The embodiments of the invention in which an exclusive property or rights is claimed are defined as follows:

1. A gallium arsenide millimeter-wave internally matched Schottky barrier beam lead diode comprising:
   a beam lead Schottky diode structure fabricated on a chip having a Schottky contact beam lead portion and an ohmic beam lead portion, said Schottky diode at said millimeter wave frequencies exhibiting unwanted but inherent parasitic reactance and lead inductive reactance; and, a matching reactive shunt path comprising in series an inductor and a capacitor fabricated on said chip adjacent said Schottky diode structure and coupled from said ohmic beam lead to said Schottky contact beam lead.

2. The structure according to claim 1 in which said inductor is fabricated on the same surface as said beam lead portions.

3. The structure according to claim 1 in which said chip comprises a semi-insulating gallium arsenide substrate having thereon an epitaxial gallium arsenide layer, which layer has a conductive region and also a surrounding non-conductive region.

4. The structure according to claim 1 in which a region of one of said beam leads also forms part of said capacitor structure.

5. The structure according to claim 1 in which one end of the inductor is connected to said ohmic beam lead and the other end is coupled to said Schottky control beam lead by said capacitor.

6. The structure according to claim 3 in which said Schottky barrier diode is fabricated at said conductive region.

7. A gallium arsenide millimeter-wave internally matched Schottky barrier beam-lead diode comprising:

a semi-insulating gallium arsenide substrate;

an epitaxial gallium arsenide layer deposited on a surface of said substrate, said layer as deposited having a conductive state, said layer having a second region thereof which has been converted to a semi-insulating state so that a first region is conductive and the second region is non-conductive;

an ohmic contact and a Schottky contact on the surface of the first conductive region;

a conductive pad forming a lower capacitor plate on the surface of said non-conductive second region;

a passivation dielectric layer over said epitaxial layer, contacts and pad, said dielectric layer having vias therethrough for electrical connection from said contacts and pad to the upper surface of said dielectric layer;

a pair of beam lead means on the surface of said dielectric layer comprising a Schottky contact beam lead and a ohmic contact beam lead, one of said beam lead means having a region overlying said pad and forming the upper capacitor plate, said lower and upper capacitor plates and the intervening dielectric layer forming a capacitor; and, a matching reactive shunt path comprising in series said capacitor and an inductor fabricated on said dielectric layer adjacent said Schottky diode structure and coupled from said ohmic beam lead to said Schottky contact beam lead.

8. The structure according to claim 7 in which said non-conductive second region of said epitaxial layer is proton or deuteron implant converted.

9. The structure according to claim 7 in which said beam leads and said inductor are plated over the dielectric layer surface.

* * * * *